United States Patent [19]

Rempt

[11] Patent Number: 4,904,940
[45] Date of Patent: Feb. 27, 1990

[54] FIBER-OPTIC MULTICOMPONENT MAGNETIC FIELD GRADIOMETER FOR FIRST, SECOND AND HIGHER ORDER DERIVATIVES

[75] Inventor: Raymond D. Rempt, Woodinville, Wash.

[73] Assignee: The Boeing Company, Seattle, Wash.

[21] Appl. No.: 325,825

[22] Filed: Mar. 20, 1989

Related U.S. Application Data

[63] Continuation-in-part of Ser. No. 169,802, Mar. 18, 1988, Pat. No. 4,814,706, which is a continuation-in-part of Ser. No. 22,681, Mar. 16, 1987, abandoned.

[51] Int. Cl.$^4$ ............... G01R 33/022; G01R 33/023; G01B 9/02
[52] U.S. Cl. ..................... 324/244; 324/260; 350/96.29; 356/345; 250/227
[58] Field of Search ............... 324/96, 244, 260; 350/96.29; 356/345; 205/227, 231 R

[56] References Cited

U.S. PATENT DOCUMENTS

| | | | |
|---|---|---|---|
| 2,485,931 | 10/1949 | Slonczewski | 324/247 |
| 4,112,367 | 9/1978 | Hepner et al. | 324/244 |
| 4,147,979 | 4/1979 | Baues et al. | 324/244 |
| 4,356,448 | 10/1982 | Brogardh | 324/244 |
| 4,371,838 | 2/1983 | Griscom | 324/244 |
| 4,376,248 | 3/1983 | Giallorenzi et al. | 250/227 |
| 4,378,497 | 3/1983 | Giallorenzi | 250/227 |
| 4,432,599 | 2/1984 | McMahon | 250/227 |
| 4,433,291 | 2/1984 | Yariv et al. | 324/244 |
| 4,442,350 | 4/1984 | Rashleigh | 250/227 |
| 4,450,406 | 5/1984 | Bobb | 324/244 |
| 4,473,723 | 9/1984 | Hobrough . | |
| 4,477,723 | 10/1984 | Carome et al. | 250/227 |
| 4,524,322 | 6/1985 | Bobb | 324/96 |
| 4,587,487 | 5/1986 | Zanaucchi | 324/244 |
| 4,591,786 | 5/1986 | Koo et al. | 324/244 |
| 4,600,885 | 7/1986 | Koo et al. | 324/244 |
| 4,609,871 | 9/1986 | Bobb | 324/244 |
| 4,622,460 | 11/1986 | Failes et al. | 250/227 |
| 4,634,977 | 1/1987 | Lenz et al. | 324/244 |
| 4,644,273 | 2/1987 | Bobb | 324/244 |
| 4,650,281 | 3/1987 | Jaeger et al. | 350/96.33 |
| 4,656,421 | 4/1987 | Ellis et al. | 324/244 |
| 4,665,363 | 5/1987 | Extance et al. | 324/244 |
| 4,675,522 | 6/1987 | Arunkumar | 250/227 |
| 4,687,993 | 8/1987 | Mermelstein | 324/244 |
| 4,697,146 | 9/1987 | Extance et al. | 324/244 |
| 4,712,065 | 12/1987 | Pitt et al. | 324/244 |
| 4,742,300 | 5/1988 | Lenz et al. | 324/244 |
| 4,814,706 | 3/1989 | Rempt | 324/244 |

OTHER PUBLICATIONS

Koo et al. "A Fiber Optic Magnetic Gradiometer" Journal of Lightwave Technology, LT-1, No. 3, 9/1983, pp. 509–513.
"A Fiber-Optic Magnetic Gradiometer", Koo et al, 1983 IEEE Journal of Lightwave Technology, vol. LT-1, No. 3, Sep. 1983.

Primary Examiner—Reinhard J. Eisenzopf
Assistant Examiner—Walter E. Snow
Attorney, Agent, or Firm—Foley & Lardner, Schwartz, Jeffery, Schwaab, Mack, Blumenthal & Evans

[57] ABSTRACT

A fiber-optic magnetic field gradiometer uses a plurality of magnetic transducers to simultaneously determine multicomponents of the gradient and field strength of an external magnetic field so as to permit accurate determination of the location of a ferromagnetic object located in an array of objects. The magnetic transducers are made of several layers of magnetostrictive glass which are wrapped with an optical fiber and immersed in an applied magnetic field to null out material differences and the earth's magnetic field. The null conditions for each adjacent pair are accomplished witout disturbing the null conditions of the other adjacent pair. The nulling technique may be accomplished in real time and does not require cutting of the DC bias coils of adjacent coils. Thus the nulling may be accomplished simultaneously for all coils as the balancing of each coil is independent of its neighbors. A magnetic field to be detected along the axes of the magnetic transducers causes an optical path length change in the fibers. By employing eight magnetic transducers, all gradients and fields may be determined at the same time. Further by employing additional transducers, for a total of thirteen, the second derivatives of the fields may also be determined.

27 Claims, 9 Drawing Sheets

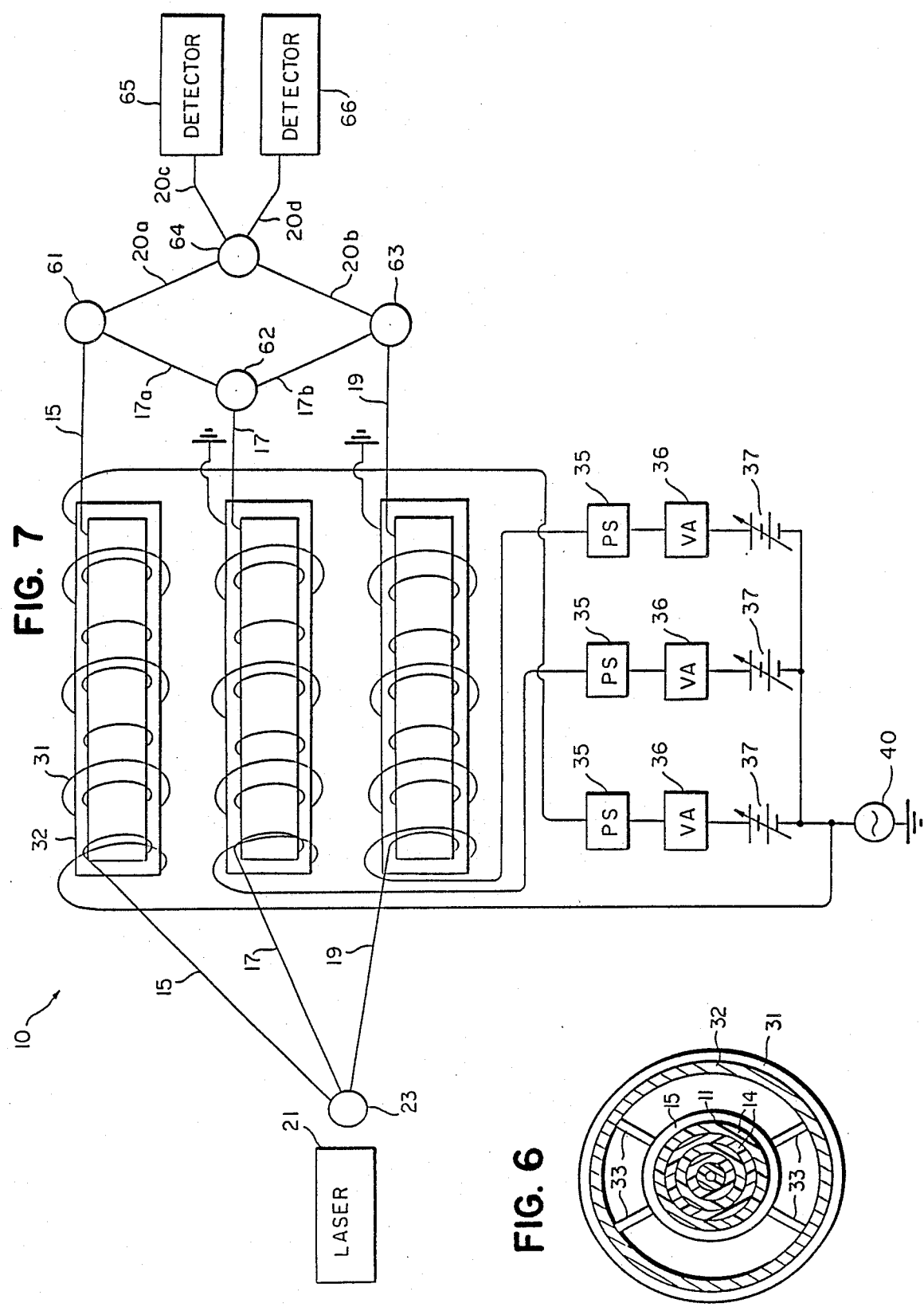

FIBER-OPTIC MULTICOMPONENT MAGNETIC FIELD GRADIOMETER FOR FIRST, SECOND AND HIGHER ORDER DERIVATIVES

CROSS-REFERENCE TO RELATED APPLICATION

This invention is a continuation-in-part of application Serial No. 07/169 802 filed Mar. 18, 1988, now U.S. Pat. No. 4,814,706, which is a continuation-in-part of application Serial No. 07/022,681, filed Mar. 6, 1987 now abandoned. The latter application is incorporated herein by reference.

BACKGROUND OF THE INVENTION

This invention relates generally to magnetic field gradiometers and in particular to a fiber-optic multicomponent magnetic field gradiometer for measuring first, second, and higher order derivatives and to methods and apparatus for nulling and balancing the gradiometer.

In the detection, identification and location of tactical and strategic targets such as trucks, mines and submarines, one of the most difficult signatures to hide is the magnetic one. Even when visible methods are fogged over or radar methods are jammed, the magnetic signature indicating the existence and location of the targets still exists. Of particular interest is the location of targets whose exact position is unknown. Ferromagnetic hardware such as tanks and trucks on the ground, and submarines and mines under the water disturb the local geomagnetic field. These disturbances, or magnetic anomalies, are detectable as changes in the magnetic field measured as a sensor flies over them. For this reason, a sensor measuring the field changes or gradient provides more useful information than one merely measuring the field itself.

Present state-of-the-art for magnetic anomaly detection employs super-conducting quantum interference devices (SQUIDS) or proton precession devices. The latter devices do not have sufficient sensitivity to detect smaller targets such as trucks at sufficient range ($\frac{1}{2}$ kilometer) as a sensor flies over them, and require laborious calibration procedures. The former devices have a high resolution but, due to their superconducting nature, require large bulky devices for cooling.

K. P. Koo and G. H. Sigel, Jr. in "A Fiber-Optic Magnetic Gradiometer," (*Journal of Light Wave Technology*, Vol. Lt-1, No. 3, Sept., 1983) disclose a fiber-optic gradiometer capable of measuring both AC and DC magnetic field gradients and is incorporated herein by reference. The concepts disclosed are shown graphically in FIGS. 1-3. FIG. 1 shows the flight trajectory of a magnetic field gradiometer as it flies at a height Z of 100 meters over three 1-meter radius iron spheres 1, 2 and 3 located on the X-axis at $-75$, 0 and 75 meters, respectively. FIG. 2 shows a graph of the magnetic field disturbances along the X-axis caused by spheres 1, 2 and 3 with the circles $1a$, $2a$ and $3a$ indicating the respective spheres. FIG. 3 shows a graph of the first derivative or the magnetic field gradient of the magnetic field with spheres 1, 2 and 3 again indicated by circles $1a$, $2a$ and $3a$, respectively. However, as can be seen in FIGS. 1-3, no information on the location of the individual spheres in the array can be derived. However, in accordance with the teachings of the above referenced application Ser. No. 07/169,802, an accurate determination of the location of the target may be obtained from using the second derivative of the magnetic field as illustrated in FIG. 4.

The above teachings do not provide a mechanism for the simultaneous measurement of field gradients in plural directions, e.g. for the determination of all three magnetic field derivatives. Further, the above techniques do not permit a simplified DC nulling of the transducers such that the nulling may be done simultaneously for all bias coils. Moreover, the above techniques do not provide a teaching of a method or apparatus for simultaneously determining the second derivative for multicomponents of the gradient while utilizing a nulling technique which permits simultaneous nulling of the DC bias coils.

Accordingly, it is an object of the present invention to provide a method and apparatus capable of simultaneously determining the magnetic field and field derivatives, both first and second order, so as to permit accurate location of a target.

Yet another object of the invention is to provide a simplified nulling or balancing technique which can be used to simultaneously and independently null each of the DC bias coils of the magnetic transducers.

A further object of the invention is to apply the simplified nulling/balancing technique to the embodiment of multicomponent field gradient measurements so as to permit a greatly simplified optical connection of the component parts thereby reducing cost, size and complexity of the resulting interferometer.

It is a further object of the invention to provide an apparatus that is small and lightweight.

Other objects and advantages of the invention will become more apparent hereinafter in reference to the detailed description of the preferred embodiments and drawings.

BRIEF SUMMARY OF THE INVENTION

A plurality of magnetic transducers are each wrapped with a single mode optical fiber. The fibers are so attached to the transducers that good coupling results when any of the transducers is subjected to a magnetic field of magnitude which is desired to be detected. Each of the transducers along with their respective fibers are immersed in an applied magnetic field to balance out material differences and the earth's magnetic field, and to establish an appropriate bias field level. Light from a laser is then launched into the single mode optical fibers and recoupled after passing through the fibers. A magnetic field along the sensitive axes of the transducer causes the magnetostrictive glass to expand or contract, thereby changing the length of the fiber affixed to it and hence changing the optical path length. The overall path length difference between any two fibers is proportional to the first derivative of the magnetic field. By simultaneously employing and configuring eight transducers, all nine gradient components and all three field components may be determined. Further, by applying a unique frequency to selected pairs of transducers, a nulling or balancing condition may be achieved for continuously and real-time nulling of the gradiometer by simultaneously adjusting the DC bias coils of each transducer independently of one another. Moreover, the nulling technique may be applied to a multicomponent embodiment to provide a frequency multiplexed multicomponent gradiometer with greatly simplified optical couplings and structure.

BRIEF DESCRIPTION OF THE DRAWINGS

FIG. 6 is a cross-sectional view of a cylinder made of a magnetostrictive glass as taken along line 6—6 of FIG. 5.

FIG. 7 is a schematic view of the magnetic field gradiometer as described in applicant's above identified copending application.

DETAILED DESCRIPTION OF THE PREFERRED EMBODIMENTS

Figure 1:
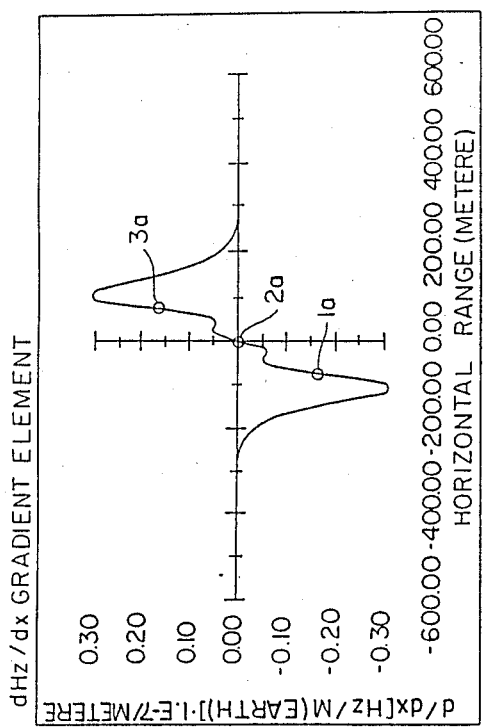
FIG. 1 is a graphical representation of a flight trajectory of a magnetic field gradiometer over three 1-meter radius spheres.
Figure 3:
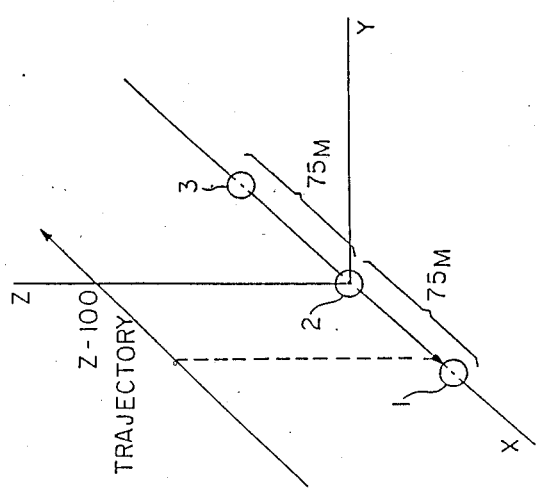
FIG. 3 is a graph of the first derivative of the magnetic field of FIG. 2.
Figure 2:
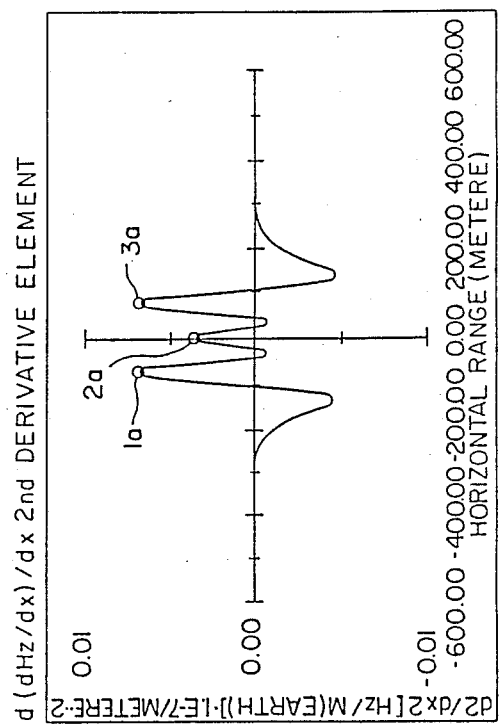
FIG. 2 is a graph of the magnetic field along the flight trajectory of FIG. 1.
Figure 4:
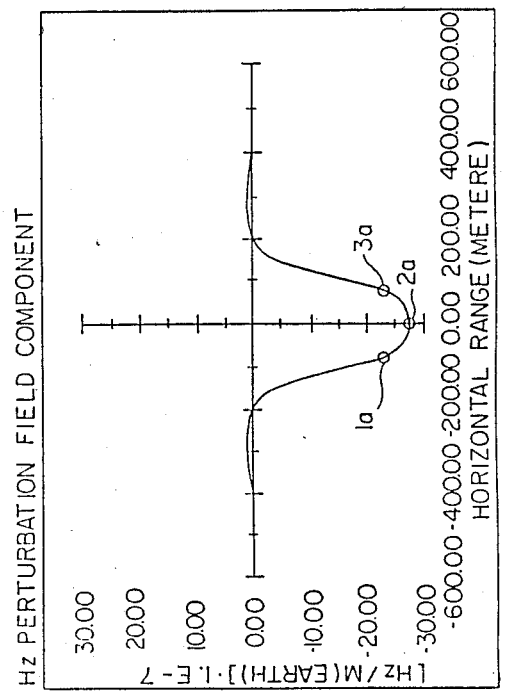
FIG. 4 is a graph of the second derivative of the magnetic field of FIG. 2 showing the location of the three 1-meter radius spheres.

For an array of targets, such as a fleet of trucks, the second derivative or gradient of the gradient of the magnetic field in the vicinity of the targets allows individual targets in the array to be located. Referring now to FIG. 4 in addition to FIGS. 1-3, the importance of measuring the second derivative may readily be appreciated. The peaks of the second derivative of the magnetic field as seen in FIG. 4 at locations $1a$, $2a$ and $3a$ give the location of the spheres 1, 2 and 3, respectively. Thus, obtaining the second derivative of a magnetic field provides the ability to pinpoint target location when there are several targets in the array.

Figure 5:
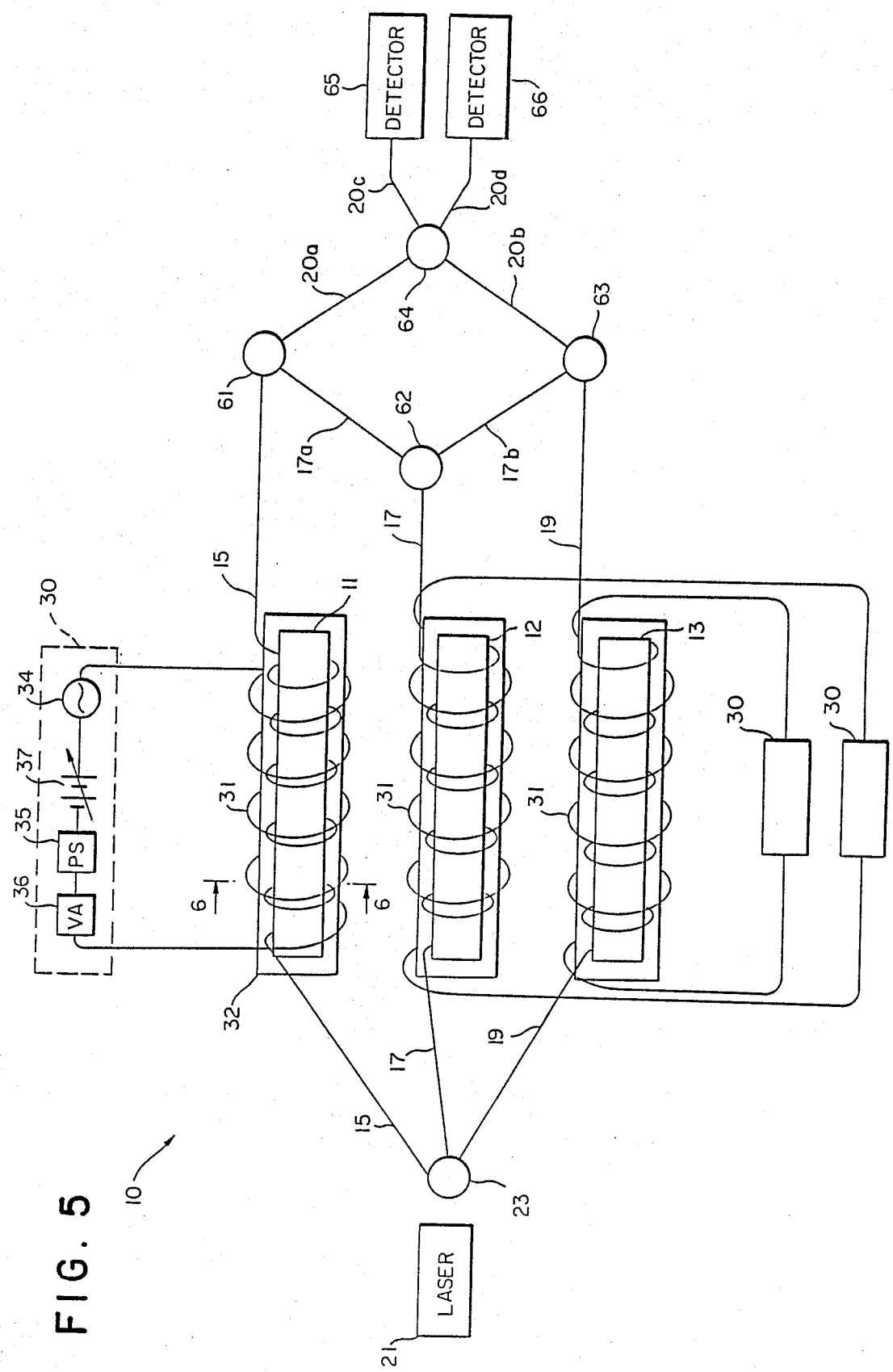
FIG. 5 is a schematic view of the magnetic field gradiometer as described in applicant's above identified copending application.

Referring now more particularly to the preferred embodiment of the invention selected for illustration, the magnetic field gradiometer according to the present invention and generally designated by reference numeral 10 is shown in FIG. 5. The gradiometer 10 is constructed using three magnetic transducers each of which has a magnetically sensitive axis which is oriented along the field direction for which it is desired to measure the second derivative. In a first embodiment, these three transducers are in the form of cylinders 11, 12 and 13 which are made of thin layers of magnetostrictive glass 14 sufficient to form a cylinder. These layers 14 are typically on the order of 0.001 inches thick, and may be made from METGLAS (trademark of Allied Corporation) with or without being annealed. The overall wall thickness of the cylinders is typically 0.001-0.01 inches. FIG. 6 illustrates a cross-section of cylinder 11 showing the layers of glass 14. The cylinders 12 and 13 are of a similar construction. Over the glass 14 for each cylinder 11, 12 and 13 are wrapped single mode optical fibers 15, 17 and 19, respectively. The fibers are so attached to the glass 14 such that good coupling results when any of the cylinders 11, 12 or 13 is subjected to a magnetic field of magnitude which is desired to be detected. The cylinders are parallel and adjacent to each other such that the central axis, i.e., the magnetically sensitive axis, of each cylinder lies in the same plane. Furthermore, the distances between the central axes of each adjacent cylinder pair are equal.

Each of the cylinders 11, 12 and 13 along with their respective fibers 15, 17 and 19 are immersed in an applied magnetic field to balance out material differences and the earth's magnetic field, and provide an appropriate bias field to ensure that the magnetostrictive strain is quadratic in field strength. One of the possible circuit connections is shown in FIG. 5. An applied magnetic field circuit 30 provides an AC and DC bias field to each cylinder 11, 12 and 13 via a coil 31 wrapped around a non-ferromagnetic tube 32 as shown for cylinder 11 in FIG. 6. Tube 32 and spacers 33 are typically constructed of glass or cardboard. Coil 31 is wrapped around tube 32 with sufficient turns to provide easy control of the applied magnetic field of appropriate magnitude. This aforementioned structure is repeated for cylinders 12 and 13. A generator 34 of frequency $\omega$ provides the AC portion of a bias field in each circuit 30. Each circuit 30 is equipped with a phase shifter 35 and a variable attenuator 36 so that each circuit 30 may be independently adjusted for amplitude and phase. In addition, a static DC magnetic field may be applied by adjusting the magnitude of the voltages at the DC supply 37 contained in each circuit 30. The DC magnetic biases are applied to compensate for any material response differences and to null off the earth's magnetic field, and to provide the appropriate bias field to ensure that the magnetostriction is quadratic in field strength. The AC field is used to upconvert a DC signal of interest to a convenient frequency well away from the effects of noise at extremely low frequencies. Since the frequency must be the same for each AC bias field, an alternative circuit connection is shown in FIG. 7 where only one generator 40 is used. The advantage of this circuit connection is that only one generator need be set to the frequency $\omega$. In practice, each bias coil is energized by AC and DC, which are summed by an operational amplifier and then fed to the respective coils.

After being wrapped around their respective cylinders, optical fibers 15, 17 and 19 are coupled together to provide the requisite interferences as shown in FIGS. 5 or 7. Coupler 62 is provided to split the optical fiber 17 into a first and second optical fiber branch. The first branch $17a$ is fed to a coupler 61 together with optical fiber 15 wherein the laser radiation is coupled to an optical fiber $20a$. The second branch $17b$ is fed to a coupler 63 together with optical fiber 19 wherein the laser radiation is coupled to an optical fiber 20b. Optical fibers 20a and 20b are coupled in coupler 64 to optical fibers 20c and 20d which are positioned to have laser radiation emanating therefrom to fall on detectors 65 and 66.

In operation, light from a laser 21 is launched through a coupler 23 into the three single mode fibers 15, 17 and 19 and recoupled after passing through the fibers on the cylinders, as pairs, between cylinders 11 and 12 at coupler 61 and cylinders 12 and 13 at coupler 63. A coupler 62 is used to split the optical signal from fiber 17 in order to allow the signal to be shared by couplers 61 and 63. The effective optical path length of fibers 15, 17 and 19 must be equal assuming a uniform magnetic field. Therefore, the length of fibers 15 and 19 must be equal. In addition, the effective length of fiber 17 from coupler 23 to coupler 61 must be equal to the length of fiber 15 from coupler 23 to coupler 61. Similarly, the effective length of fiber 17 from coupler 23 to coupler 63 must be equal to the effective length fiber 19 from coupler 23 to coupler 63.

The upper two cylinders 11 and 12 having fibers 15 and 17 recoupled at coupler 61 comprise a Mach Zender interferometer with both fibers 15 and 17 operating as measurement arms. Similarly, cylinders 12 and 13 in cooperation with fibers 17 and 19 recoupled at coupler 63 comprise another Mach Zender interferometer. Each of the two interferometers (terminating at couplers 61 and 63) are held at quadrature by standard means, for example, like that described by D. A. Jackson, R. Priest, A. Dandridge, and A. B. Tveten, Applied Optics Volume 19, pp 2926–2929, September 1980, incorporated herein by reference. Furthermore, the detectors 65 and 66 provide active stabilization in order to maintain the gradiometer in quadrature. By maintaining quadrature, the gradiometer is not affected by random phase drift due to small environmental changes and the phase of the interference signal emanating from the coupler 64 is locked. Note that the output of the gradiometer may be determined by either detector 65 or 66, and since the gradiometer is maintained at quadrature, the signal does not vanish.

Considering, for the moment, only the upper two cylinders 11 and 12, note that the total field is common mode rejected resulting in no path length change at coupler 61 when there is no field variation, and only if the field is different between the location of cylinders 11 and 12 will there be a path length change. The change may be detected if a null condition is initially achieved during set-up or calibration so as to compensate for small differences in the effective coupling of the fibers to the magnetostrictive glass at each cylinder. A magnetic field along the axes of cylinders 11 and 12 causes the magnetostrictive glass 14 to expand or contract thereby changing the effective length of the fibers 15 and 17 affixed to the magnetostrictive glass 14, and hence changing the optical path length between the two fibers 15 and 17. An increase in the magnetic field along the axis of the cylinder causes the cylinder to stretch, thereby contracting the magnetostrictive glass and the optical fiber attached thereto. Conversely, a decrease in the magnetic field along the axis causes the cylinder to contract, thereby expanding the magnetostrictive glass and the optical fiber attached thereto. With appropriate field biasing, this path length change is quadratic in the magnetic field.

As derived in detail in the above mentioned application Ser. No. 169,802, incorporated herein by reference, it may be shown that under balance conditions for two separate gradiometers involving three cylinders, coupling of the two output signals from couplers 61 and 63 via coupler 64 as measured by detectors 65 or 66 yields signals proportional to the DC second derivative at the applied bias frequency and proportional to the AC second derivative at the mixed frequencies. The detectors 65 and 66 may comprise a conventional silicon p-i-n diode coupled to a frequency analyzer, or other appropriate signal processing electronics. The concept may be extended further by additional compounding to yield third and higher order derivatives.

Multicomponent Embodiment

Figure 8:
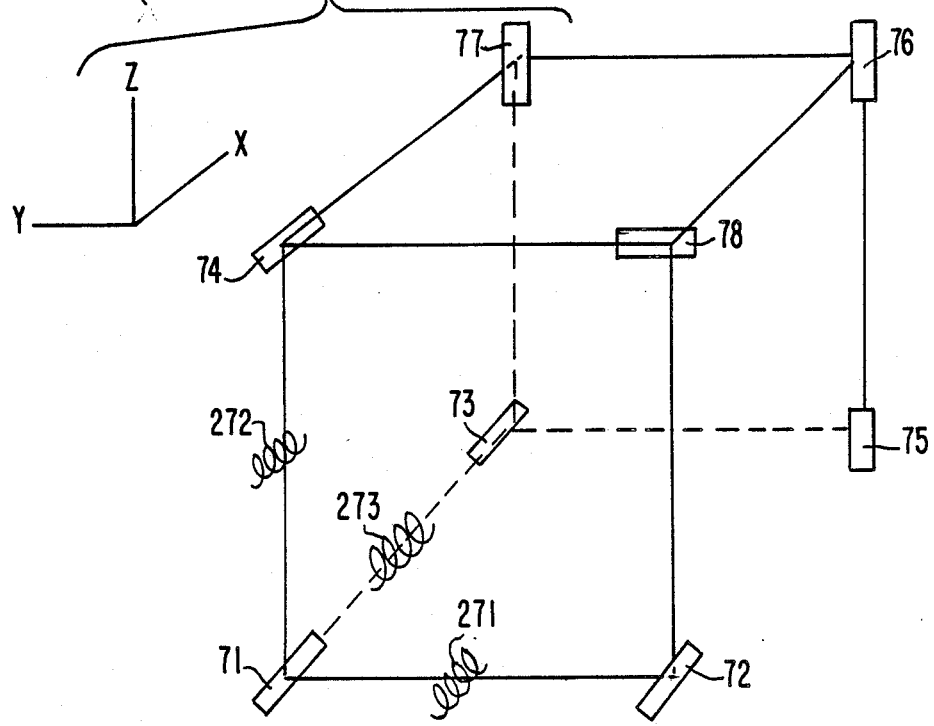
FIG. 8 is a diagrammatic representation of an embodiment of the invention wherein multicomponent gradients may be simultaneously determined.

In accordance with the principles of the invention, a plurality of eight transducers may be utilized to measure all nine gradient components and all three field components. Eight transducers 71–78 are positioned as illustrated in FIG. 8. Each transducer 71–78 is composed of a magnetostrictive structure surrounded by a bias cylinder as previously described in connection with FIGS. 5–7. Transducers 71–74 have their sensitive axis aligned in the x direction; transducers 75–77 have their sensitive axis aligned along the z axis; and transducer 78 has its sensitive axis aligned along the y direction.

Utilizing the seven transducers 71–77, the nine field gradients may be determined employing the fact that the divergence and curl of B are zero:

$$\nabla \times B = 0; \nabla \cdot B = 0.$$

Thus, $$\nabla \times B = 0; \nabla \cdot B = 0.$$

Thus, $$\frac{\partial B_x}{\partial x} + \frac{\partial B_y}{\partial y} + \frac{\partial B_z}{\partial z} = 0, \text{ and}$$

$$\frac{\partial B_x}{\partial y} = \frac{\partial B_y}{\partial x}$$

$$\frac{\partial B_x}{\partial z} = \frac{\partial B_z}{\partial x}$$

$$\frac{\partial B_z}{\partial y} = \frac{\partial B_y}{\partial z}$$

Thus determining the five independent gradient components allow one to readily calculate the remaining four gradient components. Further, coupling transducer 71 with a reference fiber permits determination of the x field component at the position of transducer 71. Providing further reference fibers for coils 76 and 78 permits determination of the z and y field components at the respective positions of transducers 76 and 78.

Figure 9:
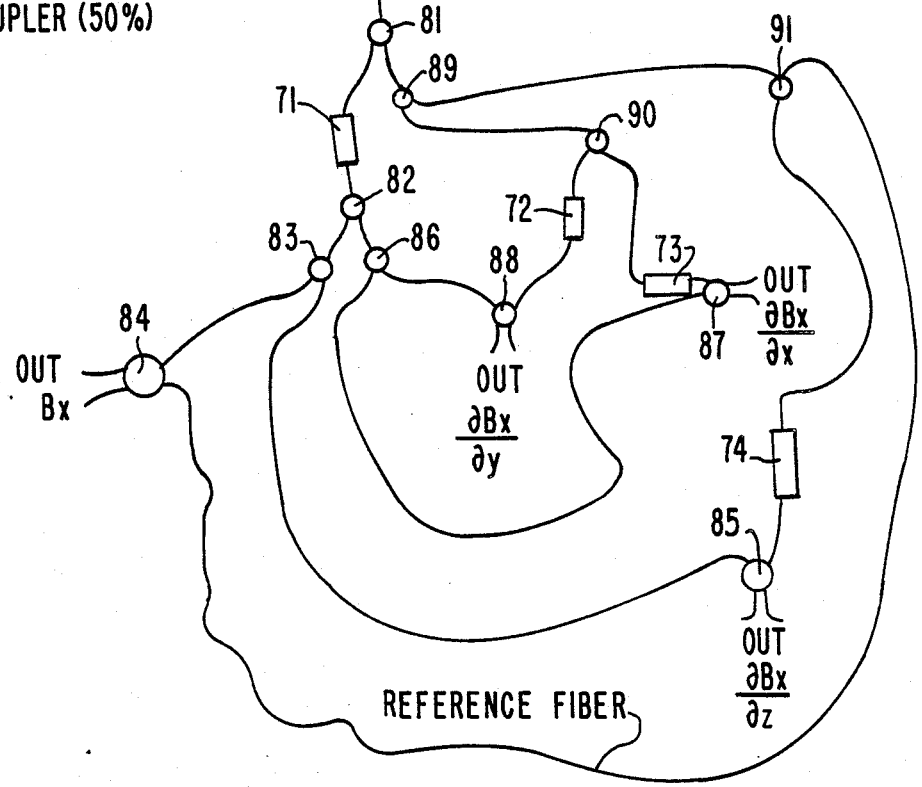
FIG. 9 is diagrammatic representation of the optical coupling arrangement which may be utilized to interconnect a portion of the transducers used in FIG. 8.

As a particular example, coils 71–74 may be coupled as illustrated in FIG. 9, utilizing couplers 81–91 and a laser 95. The gradient outputs are extracted from couplers 85, 87, and 88, and the field output is extracted from coupler 84. For example, the difference of the x field component between transducers 71 and 73 yields $\partial B_x/\partial x$; and between transducers 71 and 72 yields $\partial B_x/\partial y$; and between transducers 71 and 74 yields $\partial B_x/\partial z$. In a similar fashion, the difference in the z field component between transducers 75 and 76 yields $\partial B_z/\partial z$ and between transducers 76 and 77 yields $\partial B_z/\partial y$. (It is noted that the transducers 75, 76, and 77 could all be oriented in the y direction, in which case the difference in the y field component between transducers 75 and 76 would yield $\partial B_y/\partial z$ and between transducers 76 and 77 would yield $\partial B_y/\partial y$.)

In practice, for the full measurement of all five independent gradients and the three fields, it may be necessary to utilize two separate lasers, with each laser supporting, say four interferometers.

Figure 10:
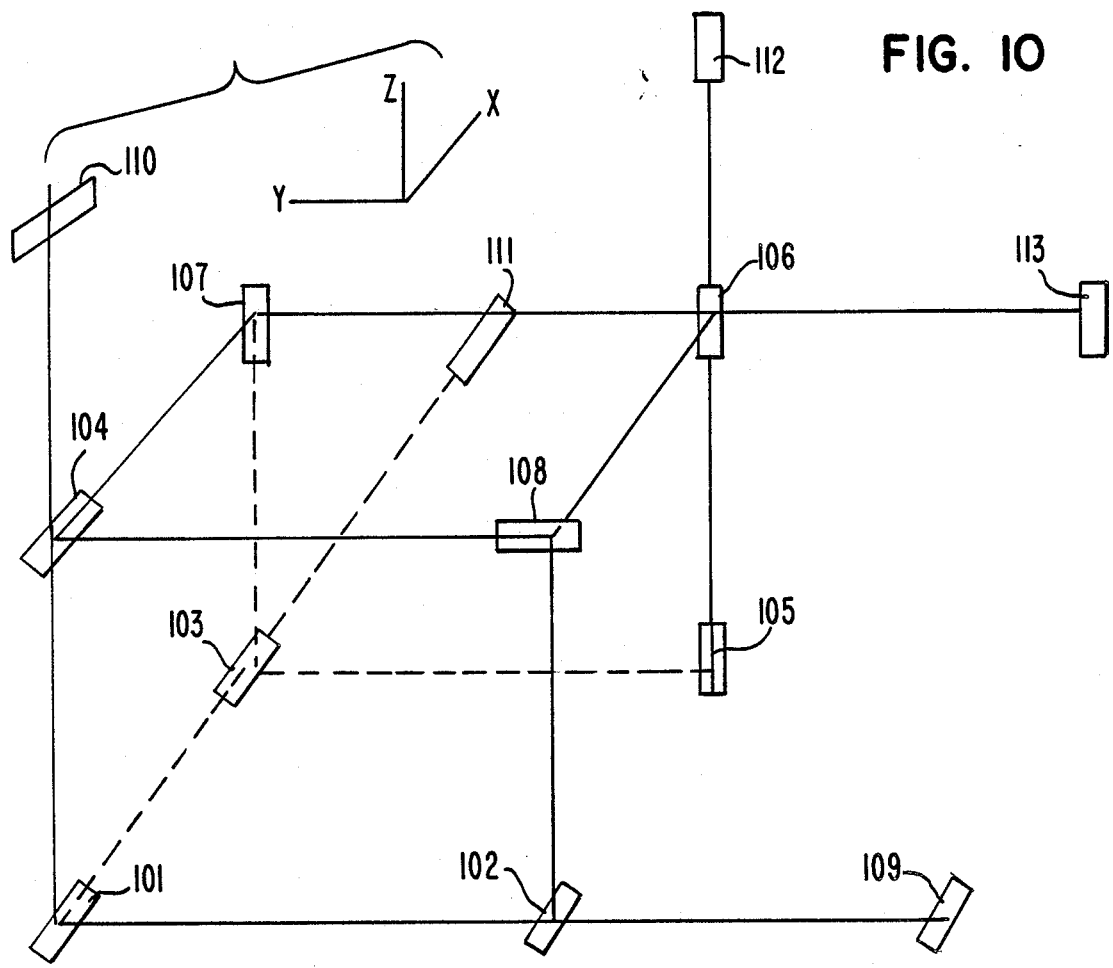
FIG. 10 is another embodiment of the invention which is an expansion of the embodiment of FIG. 8 and which is used to determining second derivatives of the field.

The multicomponent gradiometer described above may be expanded to measure the second derivative by employing an additional five transducers. This expanded arrangement is illustrated in FIG. 10 with the transducers labeled 101-113. Transducers 101-108 correspond to the transducers 71-78 of FIG. 8 with the new transducers 109-113 being positioned as illustrated. Transducers 109-111 are oriented with their sensitive axes along the x axis and transducers 112 and 113 have their sensitive axes aligned along the y axis. (It is noted that an alternate embodiment (not shown) is to align transducers 105-107 along the y axis in which event transducers 112 and 113 would also be aligned along the y axis.) The second derivatives may be obtained from the table below.

| Coils | Gradient |
|---|---|
| 101,102,109 | $\partial^2 Bx/\partial y^2$ |
| 101,104,110 | $\partial^2 Bx/\partial z^2$ |
| 101,103,111 | $\partial^2 Bx/\partial x^2$ |
| 105,106,112 | $\partial^2 Bz/\partial z^2$ |
| 107,106,113 | $\partial^2 Bz/\partial y^2$ |

Nulling/Balancino Technique

The invention also utilizes an improved technique of DC nulling in which all transducers are energized simultaneously, thereby precluding hysteresis problems associated with switching the bias coils on and off as in conventional systems. The nulling technique also provides for simultaneous and unambiguous field and gradient measurements.

In the embodiment illustrated in FIGS. 5 and 6, each of the bias coils 31 are balanced separately, requiring the other to be turned off while the first is being balanced. Then to balance the second coil, the first is turned off. After this procedure, both coils are turned on, causing each to be "jolted" slightly out of the balance due to hysteresis. The bias coils cannot both be biased simultaneously since changing the DC bias in either results in an interferometer output change, so there is no way to distinguish when one of the transducers has been DC nulled by its associated coil. In addition, one may not determine the filed itself in the gradiometer configuration.

Figure 11:
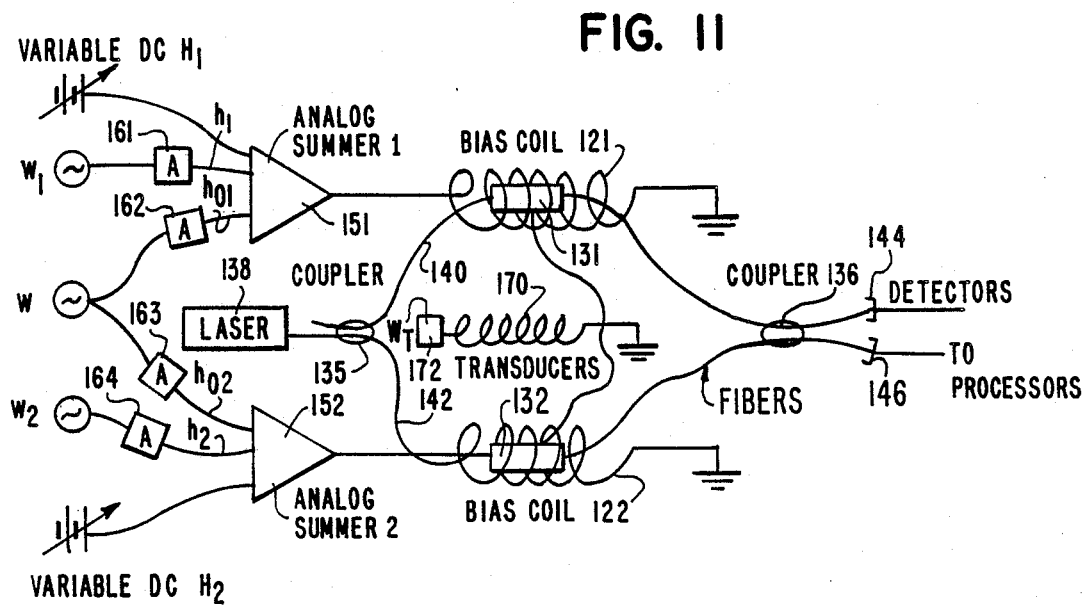
FIG. 11 illustrates yet another embodiment of the inventions utilizing the nulling/balancing technique in accordance with the invention.

In accordance with the invention, a novel nulling technique is preferably utilized and is illustrated in FIG. 11. The embodiment is illustrated for two bias coils 121 and 122, and their associated transducers 131 and 132, respectively. Transducers 131 and 132 are configured in measurement arms of a Mach Zender interferometer employing couplers 135 and 136, laser source 138, optical fibers 140, 142 and detectors 144, 146 in a similar fashion as that shown in FIGS. 5 and 7. In addition PZT (piezoelectric transducers), not shown, may be inserted onto each measurement arm to provide active feedback for maintaining quadrature and lock-up as is well known in the art. See, for example, the Jackson et al article in *Applied Optics, supra.*

The bias coils 121 and 122 are connected to analog summers 151 and 152, respectively, which are in turn each connected to receive a signal, via variable attenuators or amplifiers 161-164. The signal fed to each bias coil 121, 122 is the sum of a DC and two AC signals of different frequency. One frequency, $\omega$, is used for the two coils 121 and 122, while coil 121 has an additional signal at frequency $\omega_1$, and coil 122 has an additional signal at frequency $\omega_2$. Since the only frequency which is common to both coils 121 and 122 is $\omega$, the gradient information is contained at this frequency. DC nulling of transducer 131 is accomplished at frequency $\omega_1$, and independent nulling of transducer 132 is accomplished at frequency $\omega_2$. In addition the field itself is determined by either of the signals at $\omega_1$, or $\omega_2$ while the gradient is determined at $\omega$. For this purpose, the output of detectors 144 and 146 is fed to standard downstream electronics such as a signal processor, lock-in amplifier and spectrum analyzer. Since only transducer 131 is excited at $\omega_1$, the $\omega_1$ component of the interferometer output may be continuously monitored and DC magnetically nulled simultaneously with the component at $\omega_2$ for transducer 132. This technique provides for continual adjustment to keep each transducer balanced while not turning either of them off. Final gradient balancing is achieved by adjusting the amplitudes of the common frequency via variable attenuators 162 and 163.

The balance conditions are derived mathematically below.

Balance Conditions

The strain imported to the fibers is proportional to the square of the magnetic field applied to the transducers.

$E = \Delta l/L = CH^2$, where C is a constant.

At transducer 131, let $H_{ol}$ be the earth's field, $H_1$ the DC applied field, H the DC field to be measured, $h_{ol}$ $\cos\omega t$ the applied dither at frequency $\omega$ and $h_1 \cos\omega_1 t$ the applied dither at frequency $\omega_1$.

Then for transducer 131
$\Delta L_1 = C_1 L_1 [H_{ol} + H_1 + H + h_{ol}\cos\omega_1 t]^2$ At transducer 132, the field to be measured has the value $H + \Delta H$; and with corresponding notation $\Delta L_2 = C_2 L_2 [H_{o2} + H_2 + (H + \Delta H) + h_{o2}\cos\omega t + h_2\cos\omega_2 t]^2$ At the interferometer output, the net phase change is proportioned to the difference between $\Delta L_2 + \Delta L_1$ or $\Delta \phi_{total} \sim \Delta L_2 - \Delta L_1$.

Performing the squaring and looking only at terms involving coswt which is the contribution at the common frequency, yields:

$\Delta\phi_\omega \sim 2C_2L_2[H_{2o}h_{o2} + H_2h_{o2} + Hh_{o2} + \Delta Hh_{o2}] - 2C_1L_1[H_{ol}h_{ol} + H_1h_{ol} + Hh_{ol}]$ This difference may be regrouped as
$2C_2L_2h_{o2}[H_{o2} + H_2] - 2C_1L_1h_{ol}[H_{ol} + H_1] + 2H[L_2C_2h_{o2} - C_1L_1h_{ol}] + 2C_2h_{o2}\Delta H$ If $H_1$ and $H_2$ are adjusted such that $2C_2L_2h_{o2}[H_{o2} + H_2] - 2C_1L_1h_{ol}[H_{ol} + H_1] +$ -continued
$$2H[L_2C_2h_{o2} - C_1L_1h_{o1}] + 2C_2h_{o2}\Delta H$$

and if $h_{o2}$ and $h_{o1}$ are adjusted such that (B) $C_2L_2h_{o2} - C_1L_1h_{o1} = 0$ then the signal at $\omega$ is proportional to the gradient.

The DC adjustments, condition (A), cannot be done looking at the common $\omega$ component unless the coils are energized one at a time. This causes hysteresis problems when each coil is reenergized, as well as interrupting the measurement process. If the contributions at $\omega_1$ and $\omega_2$ are looked at, then $$\Delta\phi_{\omega 1} \sim -2C_1L_1[H_{o1}h_1 + H_1h_1 + Hh_1] =$$
$$-2C_1L_1 h_1 [H_{o1} + H_1] - 2C_1L_1h_1H$$

$$\Delta\phi_{\omega 2} \sim 2C_2L_2 [H_{o2}h_2 + H_2 h_2 + H h_2 + \Delta Hh_2] =$$
$$+2C_2L_2h_2 [H_{o2} + H_2] + 2C_2L_2h_2 (H + \Delta H)$$

So by again adjusting $H_2 + H_1$, the same condition as in (A) can be met, but this time unambiguously, and, if desired, simultaneously, since one looks at components $\omega_1$ and $\omega_2$ which are at different frequencies. This adjustment may be done at anytime without interrupting the measurement process. Also, the DC field of interest H, appears as the residual signal at $\omega_1$ and/or $\omega_2$. To null and balance the gradiometer one first selects some reasonable values for the amplitudes of $\omega_1$ and $\omega_2$ (for example, $h_1 \simeq h_2$) so as to stimulate the METGLAS but not drive it out of its quadratic region.

Then, it is only necessary to minimize the contribution at $\omega_1$ by adjusting $H_1$, and minimize the contribution at $\omega_2$ by adjusting $H_2$ to null the DC field experienced by each of the two transducers 131 and 132. For this purpose, one simply looks independently at the interferometer output signals at frequencies $\omega_1$ and $\omega_2$. The remaining step of balancing is performed by adjusting $h_{o2}$ and $h_{o1}$ to satisfy condition (B). The parameters $h_{12}$ and $h_{o1}$ are adjusted so as to minimize the interference output signal at the common frequency $\omega$. The technique then provides the gradient signal at $\omega$, the field signal at $\omega_1$ or $\omega_2$, and the process is continually performable, even during measurement.

In adjusting the amplitudes for the common frequency $\omega$ (e.g., $h_{o1}$ and $h_{o2}$) to achieve balancing, the minimum signal output of the interferometer at the common frequency $\omega$ is rather broad making it difficult to determine the minimum. In order to sharpen the minimum, it has been found advantageous to place a solenoid coil (without a transducer) in the center between coils 121 and 122 and to excite this central coil at a small frequency $\omega_t$. For this purpose, a central coil 170 is shown in FIG. 11. Coil 170 is driven at frequency $\omega_t$ via attenuator 172. Coil 170 is aligned with coils 121 and 122. The AC gradient impressed on the coils 121 and 122 will now be at the sidebands $\omega \pm \omega_t$. Typically, $\omega_t$ may be on the order of 20-200 Hz as compared to the common frequency $\omega$ on the order of 10 KHz. In the more general case described below, $\omega_t$ is selected to be small with respect to all common frequencies so as to sharpen the minimum and balance each coil in a region where the amplitude due to the so-called "residual" signals are small. Using $\omega_t$, the final balancing step is performed by adjusting the common frequency amplitudes, e.g., $h_{o1}$ and $h_{o2}$, to minimize the interference signal while looking at one of the sideband frequencies $\omega \pm \omega_t$.

It is pointed out that if the coil 170 is positioned anywhere in the median plane between coils 121 and 122, the above procedure may still be utilized even though there is now a possibility of a small gradient at $\omega_t$. This gradient, however, is of no interest and has no effect on the DC nulling.

Frequency Multiolexed Multicomponent Embodiment

Figure 12:
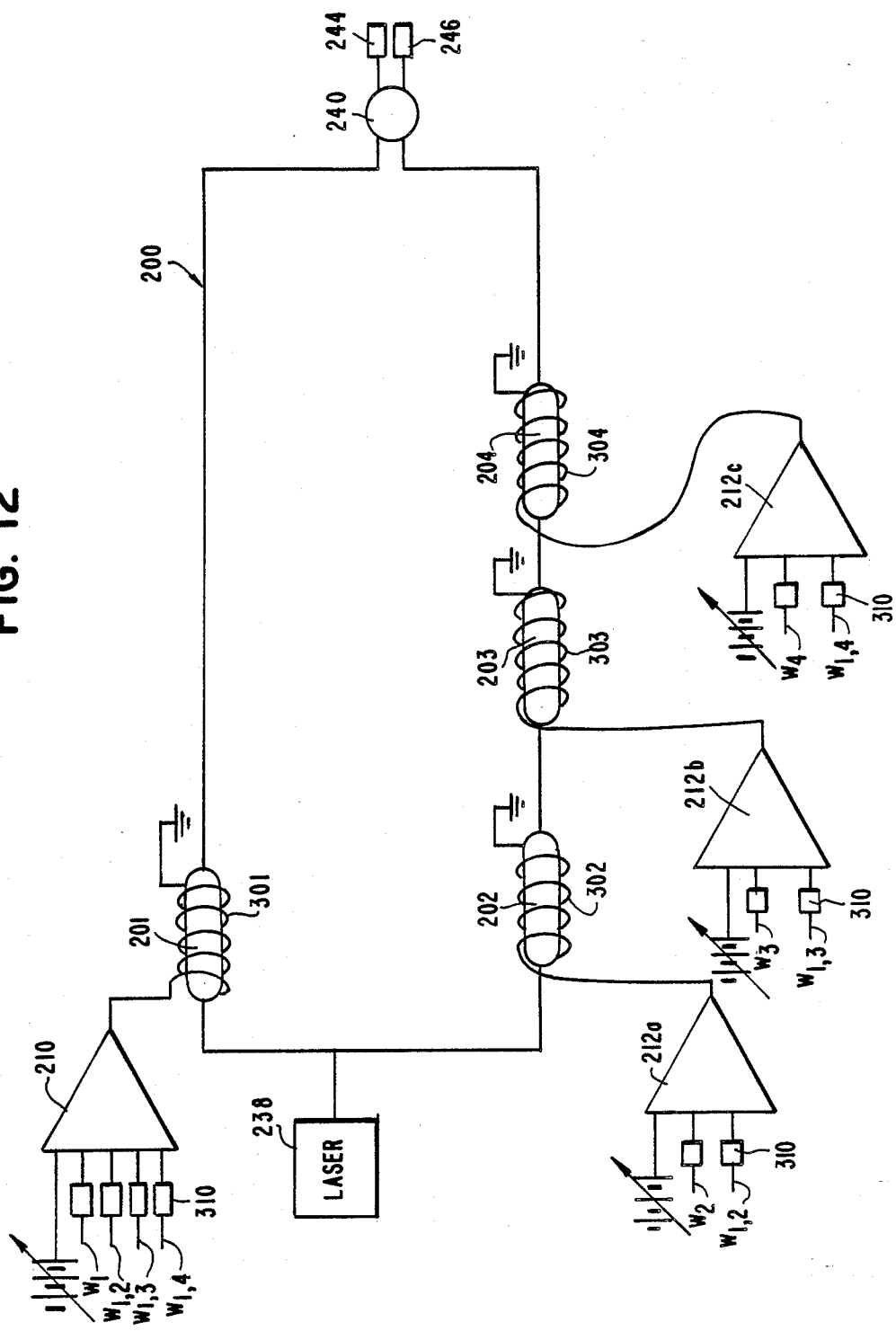
FIG. 12 illustrates the nulling/balancing technique of FIG. 11 applied to a multicomponent embodiment of the invention.

In yet another embodiment of the invention, the above-enunciated nulling technique may be applied to a multicomponent fiber optic magnetometer such as that shown in FIG. 9 and has the effect of greatly simplifying optical complexity by reducing the number of couplers, splices, detectors, etc. This embodiment may be termed a frequency multiplexed multicomponent embodiment of the invention since plural frequencies are employed in a single interferometer to measure multicomponents of fields. This embodiment of the invention is illustrated in FIG. 12, and is seen to comprise transducers 201 in one arm of a Mach Zender interferometer 200 and transducers 202-204 in the other arm. The transducers 201-204 are connected by fiber optics to a laser 238 and the interferometer output is fed via coupler 240 to detectors 244 and 246. It is noted that transducers 201-204 may be physically positioned at locations identical to the positions of transducers 71-74, respectively, of FIG. 8, and in fact, the embodiment of FIG. 12 represents an alternate and simplified embodiment of the interferometer of FIG. 9.

The electrical biasing circuit used in FIG. 12 is an adaptation of the biasing circuit for the nulling technique of FIG. 11. Thus, the circuit includes bias coils 301-304 for the respective transducers 201-204 and analog summers 210 and 212a-212c for each of the transducers 201-204. Summer 210 has a variable DC input, and four AC inputs, namely, frequency $\omega_1$ exclusive for coil 301 and frequencies $\omega_{1,2}$, $\omega_{1,3}$, and $\omega_{1,4}$ common to respective coil pairs 301-302; 301-303 and 301-304. Summer 212a has a variable DC input and two AC inputs, namely, frequency $\omega_2$ exclusive to coil 302 and frequency $\omega_{1,2}$ common to coil pair 301-302. Summer 212b has a DC input and AC inputs at frequency $\omega_3$, exclusive to coil 303, and frequency $\omega_{1,3}$ common to coils 301 and 303. Summer 212c has a DC input and AC inputs at frequency $\omega_4$, exclusive to coil 304 and frequency $\omega_{1,4}$ common to coils 301 and 304. Each AC input of summers 210 and 212a-212c is fed through a variable attenuator 310. The output of detectors 244, 246 are fed to a series connected signal processor, lock-in amplifier and spectrum analyzer (not shown) and provide the same four outputs as in FIG. 9, namely, $B_x$ (from coil 301 at $\omega_1$), $\partial B_x/\partial y$ (from coils 301, 302 at $\omega_{1,2}$) $\partial B_x/\partial x$ (from coils 301, 303 at $\omega_{1,3}$) and $\partial B_x/\partial z$ (from coils 301, 304 at $\omega_{1,4}$).

It is noted that the frequencies $\omega_1$, $\omega_2$, $\omega_3$ and $\omega_4$ as well as the common frequencies $\omega_{1,2}$, $\omega_{1,3}$ and $\omega_{1,4}$ are appropriately selected so as to be easily distinguished in the downstream frequency analyzer. To further sharpen the balancing conditions, one may also employ a central coil, such as coil 170 in FIG. 11, located along the median plane between each transducer and energized at a frequency $\omega_t$. Such coils are shown at 271-273 in FIG. 8. The AC gradient thus impressed on the transducers will be at the sidebands of $\omega_t$, namely, the common frequencies $\pm \omega_t$.

Figure 13:
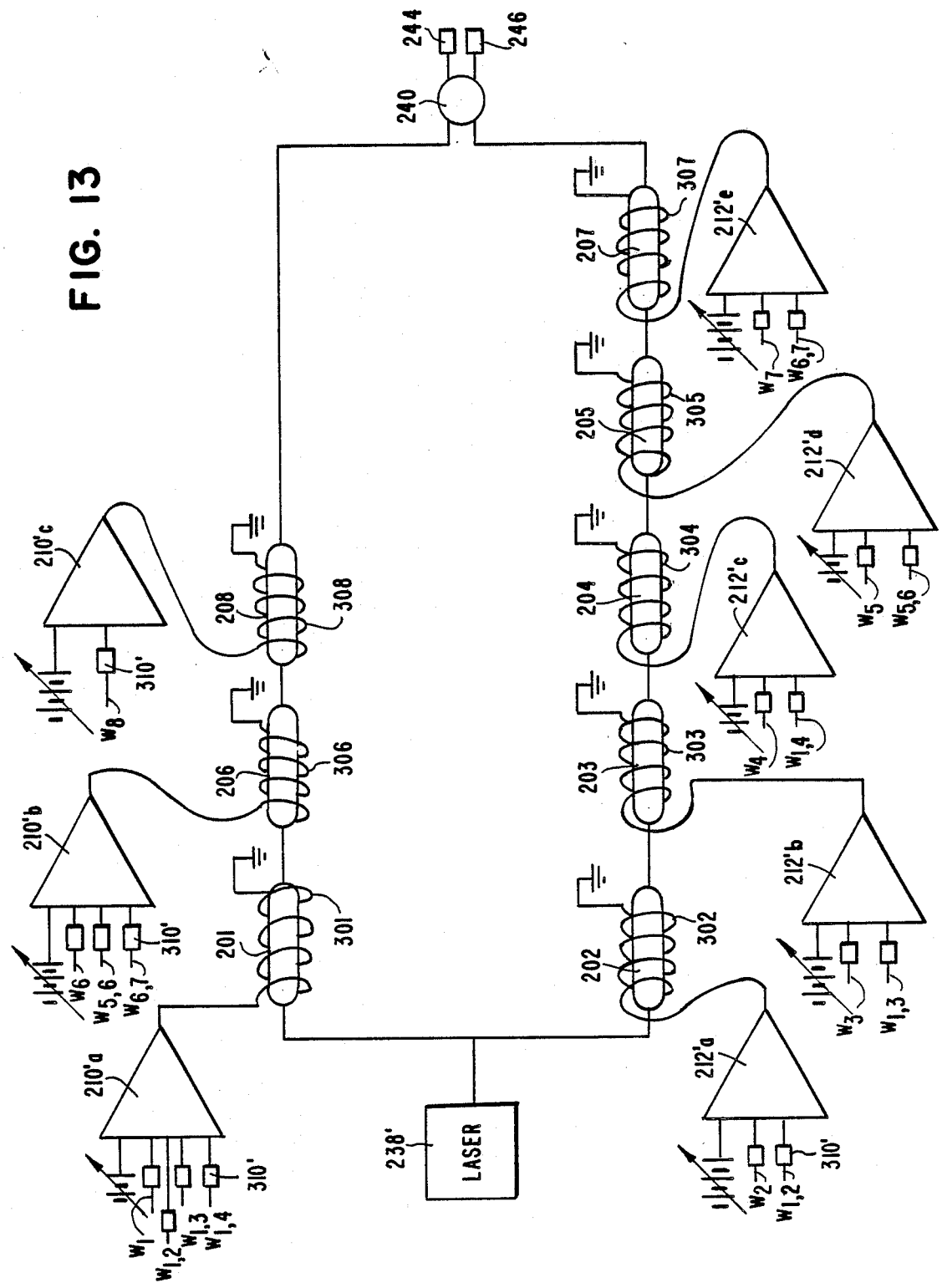
FIG. 13 is similar to FIG. 12 but illustrates the nulling/balancing technique applied to eight magnetic transducers.

The nulling technique in accordance with the invention may also be applied and expanded to encompass the full eight transducer arrangement illustrated in FIG. 8 with a greatly simplified optical layout as shown in FIG. 13; e.g., simplified over the comparable arrangement which would result from expanding the embodiment of FIG. 9 for eight transducers. In FIG. 13, transducers 201-208 correspond to and are positioned similarly to the transducers 71-78 of FIG. 8, and each transducer 201-208 has an associated bias coil 301-308. Primed numbers are utilized to represent similar components as in FIG. 12, e.g., summer 238'. In this case, the upper arm of the interferometer has three summers 210'a-210'c and the lower arm has summers 212'a-212'e with DC and AC input as indicated.

In the arrangement of FIG. 13, the same five independent gradients and the three field components are measured just as in FIG. 8 with the following coils.

| Coil(s) | Frequency | Field/Gradient |
|---|---|---|
| 301 | $\omega_1$ | $B_x$ |
| 308 | $\omega_8$ | $B_y$ |
| 306 | $\omega_6$ | $B_z$ |
| 301,303 | $\omega_{1,3}$ | $\partial B_x/\partial x$ |
| 301,302 | $\omega_{1,2}$ | $\partial B_x/\partial y$ |
| 301,304 | $\omega_{1,4}$ | $\partial B_x/\partial z$ |
| 305,306 | $\omega_{5,6}$ | $\partial B_z/\partial z$ |
| 306,307 | $\omega_{6,7}$ | $\partial B_z/\partial y$ |

The nulling and balancing steps are done the same as explained above in relation to FIGS. 8 and 11. For the eight transducers 71-78 of FIG. 8, the small frequency $\omega_f$ for the sideband may be provided by positioning two coils in the center of the cube defined by the eight transducers. One of these "central" coils is oriented along the x axis, whereas the other is oriented along the z axis. To ease the balance, these central coils may be energized at slightly different frequencies, separated, for example, by 5-20 Hz. Alternately, a single "central" coil may be utilized in the center of the cube if it is oriented so as to have a projection of its axis falling along the x and z directions.

Figure 14:
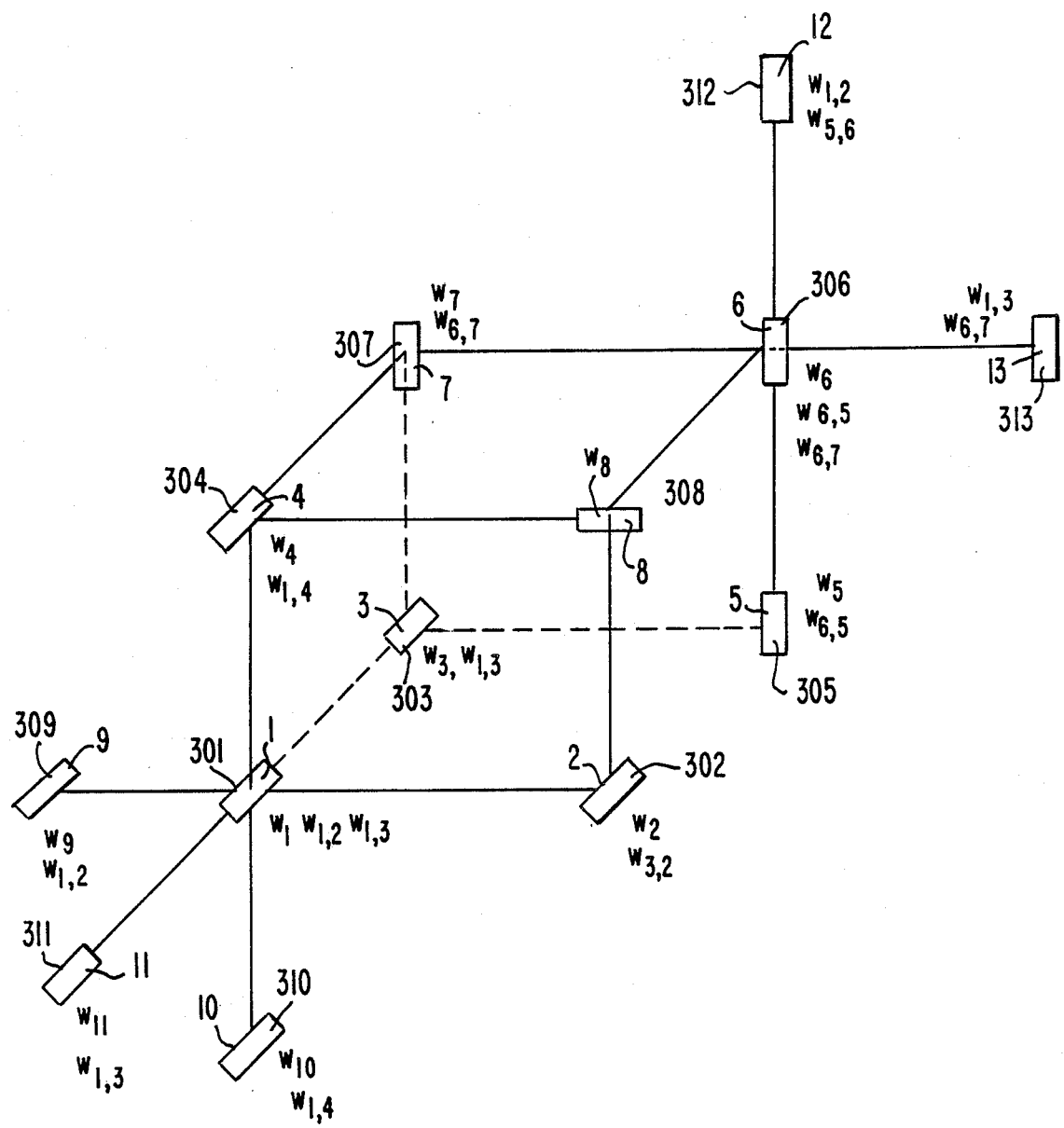
FIG. 14 illustrates an embodiment of the invention similar to FIG. 10 but shows an alternate arrangement of the magnetic transducers.
Figure 15:
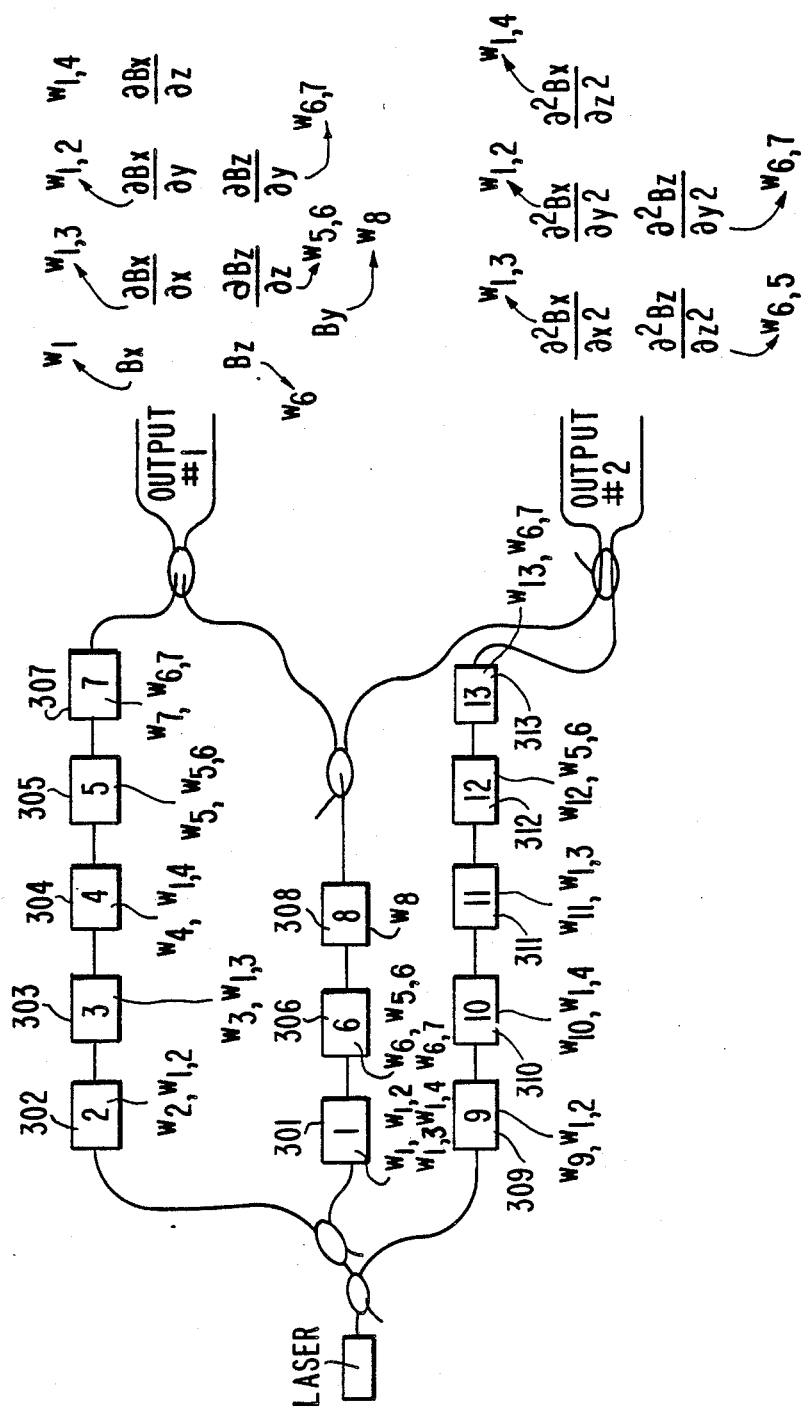
FIG. 15 illustrates an expansion of the embodiment of FIG. 13 wherein the nulling/balancing technique in accordance with the invention is applied to thirteen magnetic transducers.

In some cases, it is advantageous to detect one or more components of the second derivative in addition to the field components and their five independent first derivatives. In this case, additional transducers and a second interferometer is required, as shown in FIGS. 14, and 15. For simplicity, only coils 301-313 are shown in FIGS. 14 and 15 wherein it is understood that these coils are connected in an electrical circuit in a similar manner as coils 301-308 of FIG. 13. The following table gives the second derivative outputs.

| Coils | Frequency | Field/Gradient |
|---|---|---|
| 301 | $\omega_1$ | $B_x$ |
| 308 | $\omega_8$ | $B_y$ |
| 306 | $\omega_6$ | $B_z$ |
| 301,303 | $\omega_{1,3}$ | $\partial B_x/\partial x$ |
| 301,302 | $\omega_{1,2}$ | $\partial B_x/\partial y$ |
| 301,304 | $\omega_{1,4}$ | $\partial B_x/\partial z$ |
| 305,306 | $\omega_{5,6}$ | $\partial B_z/\partial z$ |
| 306,307 | $\omega_{6,7}$ | $\partial B_z/\partial y$ |
| 301,302,309 | $\omega_{1,2}$ | $\partial^2 B_x/\partial y^2$ |
| 301,304,310 | $\omega_{1,4}$ | $\partial^2 B_x/\partial z^2$ |
| 301,303,311 | $\omega_{1,3}$ | $\partial^2 B_x/\partial x^2$ |
| 305,306,312 | $\omega_{5,6}$ | $\partial^2 B_z/\partial z^2$ |
| 307,306,313 | $\omega_{6,7}$ | $\partial^2 B_z/\partial y^2$ |

The advantages of the present invention are numerous. It will find great utility as a small, light-weight magnetic field gradiometer capable of determining position of a ferromagnetic object in an array of objects by simultaneously measuring multicomponent gradients, as well as the field itself. An additional advantage is the ease of calibration. Moreover, the nulling technique permits real-time balancing of the DC bias coils simultaneously and independently of one another and permits greatly simplified optical couplings for multifrequency, multicomponent embodiments.

Thus, although the invention has been described relative to specific embodiments thereof, it is not so limited and numerous variations and modifications thereof will be readily apparent to those skilled in the art in light of the above teaching. It is therefore to be understood that within the scope of the appended claims, the invention may be practiced otherwise than as specifically described.

What is claimed is:

1. A multicomponent magnetic field gradiometer comprising:
   (a) first through fourth magnetic transducers, each having a magnetically sensitive axis oriented along a first, x direction, wherein said first and third magnetic transducers are colinear and said second and fourth magnetic transducers are displaced along a second, y direction and a third, z direction respectively relative to said first and third magnetic transducers, said x, y and z directions being mutually perpendicular;
   (b) first through fourth optical fibers, one fiber wrapped around each of said magnetic transducers wherein said fibers define first through fourth optical paths;
   (c) laser means coupled to said fibers for providing laser light within said fibers, wherein the laser light travels along the optical paths defined by said fibers;
   (d) an applied magnetic field generating means for immersing each of said magnetic transducers in an applied magnetic field having an AC and a DC component; and
   (e) first means operative when said fibers are to an external magnetic field to be measured for detecting a change in the length $\Delta L_{1,j}$ of the optical paths defined by said fibers between said first and jth magnetic transducers, where j takes on integral values 2, 3 and 4, said changes in length proportional to the gradient of Bx in the x, y and z directions.

2. A multicomponent magnetic field gradiometer as claimed in claim 1 wherein said changes in length are related to said field gradients according to the following formulas:

$$\Delta L_{1,3} = \partial B_x/\partial x$$

$$\Delta L_{1,2} = \partial B_x/\partial y$$

$$\Delta L_{1,4} = \partial B_x/\partial z.$$

3. A multicomponent magnetic field gradiometer as claimed in claim 1 further comprising:
   (a) fifth through seventh magnetic transducers, each having a magnetically sensitive axis oriented in one of the y or z directions, two of said fifth through seventh magnetic transducers being colinear;

(b) fifth through seventh optical fibers, one fiber wrapped around each of said fifth through seventh magnetic transducers wherein said fifth through seventh fibers define fifth through seventh optical paths;

(c) laser means coupled to said fifth through seventh optical fibers for providing laser light through said fifth through seventh optical fibers, wherein the laser light travels along the fifth through seventh optical paths defined by said fifth through seventh optical fibers;

(d) said applied magnetic field generating means further immersing each of said fifth through seventh magnetic transducers in an applied magnetic field having an AC and a DC component; and (e) said first means further operative when said fifth through seventh fibers are subjected to an external magnetic field to be measured for detecting a change in the length of the fifth through seventh optical paths, said changes in length proportional to (1) the gradient of By in the y, and z directions when said fifth through seventh magnetic transducers are oriented along said y direction, and (2) the gradient of Bz in the y and z directions when said fifth through seventh magnetic transducers are oriented along said z direction.

4. A multicomponent magnetic field gradiometer as claimed in claim 1 further comprising:
(a) a reference optical fiber defining a reference optical path not containing a magnetic transducer therein; and
(b) means for coupling said reference optical path to said first optical path containing said first magnetic transducer to form an interferometer for measuring the magnetic field Bx, by measuring a change in length between the first and reference optical paths.

5. A multicomponent magnetic field gradiometer as claimed in claim 4 wherein said means for measuring said magnetic field Bx is performed with said first means for measuring said gradient magnetic fields.

6. A multicomponent magnetic field gradiometer as claimed in claim 3 further comprising:
(a) an eighth magnetic transducer;
(b) an eighth optical fiber wrapped around said eighth magnetic transducer and defining an eighth optical path;
(c) said laser means coupled to said eighth optical, fiber for providing laser light within said eighth optical fiber, wherein the laser light travels along the optical path defined by said eighth optical fiber;
(d) said applied magnetic field generating means further immersing said eighth magnetic transducer in an applied magnetic field having an AC and a DC component;
(e) a reference optical fiber defining a reference optical path not containing a magnetic transducer therein; and
(f) means for coupling said reference optical paths to said eighth optical path containing said eighth magnetic transducer to form an interferometer for measuring the magnetic field By, by measuring a change in length between the eighth and reference optical paths.

7. A multicomponent magnetic field gradiometer as claimed in claim 1, wherein said first through fourth magnetic transducers each comprise a first through fourth cylinder, said first through fourth optical fibers wrapped on said first through fourth cylinders, respectively.

8. A multicomponent magnetic field gradiometer as claimed in claim 1, wherein said first through fourth optical fibers are single mode fibers.

9. A multicomponent magnetic field gradiometer as claimed in claim 1, wherein said applied magnetic field generating means comprises means for independently adjusting said AC and DC components for each of said cylinders.

10. A multicomponent magnetic field gradiometer as claimed in claim 1, wherein said applied magnetic field generating means comprises means for independently adjusting an amplitude and phase characteristic of said AC component and an amplitude characteristic of said DC component for each of said cylinders.

11. A multicomponent magnetic field gradiometer as claimed in claim 1, wherein said first through fourth magnetic transducers are positioned sufficiently spaced apart from one another so that each is not disturbed by the presence of the other.

12. A multicomponent magnetic field gradiometer as claimed in claim 9, wherein said AC and DC adjusting means are operable for nulling effects due to differences in materials, nulling the earth's magnetic field, and for establishing an appropriate bias field when said gradiometer is not subjected to said external magnetic field to be measured wherein each of said optical paths are of equal length.

13. A multicomponent magnetic field gradiometer as claimed in claim 6, wherein each of said optical fibers is a single mode fiber.

14. A multicomponent magnetic field gradiometer as claimed in claim 4, wherein each of said optical fibers is a single mode fiber.

15. A multicomponent magnetic field gradiometer as claimed in claim 3, wherein each of said optical fibers is a single mode fiber.

16. A multicomponent magnetic field gradiometer as claimed in claim 1, wherein said detecting means comprises a detector coupled to signal processing electronics.

17. A multicomponent magnetic field gradiometer as claimed in claim 3 further comprising:
(a) an additional first through fifth magnetic transducer, said additional first through third magnetic transducers each having a magnetically sensitive axis oriented along the x direction and said additional fourth and fifth magnetic transducers having a magnetically sensitive axis oriented along one of the y or z directions;
(b) an additional first through fifth optical fiber one of said additional first through fifth optical fibers wrapped around each of said additional first through fifth magnetic transducers, wherein said additional first through fifth optical fibers define additional first through fifth optical paths;
(c) laser means coupled to said additional first through fifth optical fibers for providing laser light through said additional first through fifth optical fibers, wherein the laser light travels along the additional first through fifth optical paths defined by said additional first through fifth optical fibers;
(d) said applied magnetic field generating means further immersing each of said additional first through fifth magnetic transducers in an applied magnetic field having an AC and a DC component; and (e) second means operative when said additional first through fifth optical fibers are subjected to an external magnetic field to be measured for measuring the second derivative of said external magnetic field Bx in the x, y and z directions and for measuring one of (1) the second derivative of Bz in the y and z directions when said fifth through seventh magnetic transducers and said additional fourth and fifth magnetic transducers are oriented along said z direction and (2) the second derivative of By in the y and z directions when said fifth through seventh magnetic transducers and said additional fourth and fifth magnetic transducers are oriented along said y direction.

18. A multicomponent magnetic field gradiometer as claimed in claim 6 further comprising:
   (a) an additional first through fifth magnetic said additional first through third magnetic transducers each having a magnetically sensitive axis oriented along the x direction and said additional fourth and fifth magnetic transducers having a magnetically sensitive axis oriented along one of the y or z directions;
   (b) an additional first through fifth optical fiber, one of said additional first through fifth optical fibers wrapped around each of said additional first through fifth magnetic transducers, wherein said additional first through fifth optical fibers define additional first through fifth optical paths;
   (c) laser means coupled to said additional first through fifth optical fibers for providing laser light through said additional first through fifth optical fibers, wherein the laser light travels along the additional first through fifth optical paths defined by said additional first through fifth optical fibers;
   (d) said applied magnetic field generating means each of said additional first through fifth magnetic transducers in an applied magnetic field having an AC and a DC component; and
   (e) second means operative when said additional first through fifth optical fibers are subjected to an external magnetic field to be measured for measuring the second derivative of said external magnetic field Bx in the x, y and z directions and for measuring one of (1) the second derivative of Bz in the y and z directions when said fifth through seventh magnetic transducers and said additional fourth and fifth magnetic transducers are oriented along said z direction and (2) the second derivative of By in the y and z directions when said fifth through seventh magnetic transducers and said additional fourth and fifth magnetic transducers are oriented along said y direction.

19. A method of detecting multicomponent magnetic field gradients of an external magnetic field comprising the steps of:
   (a) orienting a magnetically sensitive axis of a first through fourth magnetic transducer along a first given direction, defined as the x direction, along which the gradient of the external magnetic field is desired to be measured, said magnetic transducers wrapped with a first through fourth optical fiber, respectively;
   (b) transmitting a coherent radiation beam through each of said first through fourth optical fibers, said first through fourth optical fibers defining, respectively, first through fourth optical paths;
   (c) applying a bias magnetic field having AC and DC components to immerse each of said magnetic transducers in said bias magnetic field;
   (d) in the absence of said external magnetic field, detecting an optical path length difference between adjacent pairs of said first through fourth optical paths and adjusting said AC and DC components of said bias magnetic field to establish a bias field; and
   (e) then, in the presence of said external field, detecting optical path length differences between adjacent pairs of said first through fourth magnetic transduces to thereby detect said field gradients of said external magnetic field.

20. A method as claimed in claim 19, wherein said step (e) includes detecting path length differences between said first and second optical paths, said first and third optical paths and said first and fourth optical paths for determining the gradient of Bx in the x, y and z directions.

21. A method as claimed in claim 20, comprising the steps of:
   (a) orienting a magnetically sensitive axis of a fifth through seventh magnetic transducer along a second given direction, defined as one of the y or z directions, along which the gradient of the external magnetic field is desired to be measured, said magnetic transducers wrapped with a fifth through seventh optical fiber, respectively;
   (b) transmitting a coherent radiation beam through each of said fifth through seventh optical fibers, said fifth through seventh optical fibers defining, respectively, fifth through seventh optical paths;
   (c) applying a bias magnetic field having AC and DC components to immerse each of said fifth through seventh magnetic transducers in said bias magnetic field;
   (d) in the absence of said magnetic external field, detecting an optical path length difference between adjacent pairs of said fifth through seventh optical paths and adjusting said AC and DC components of said bias magnetic field to establish a bias field; and
   (e) then, in the presence of said external magnetic field, detecting optical path length differences between adjacent pairs of said fifth through seventh magnetic transducers to thereby detect said field gradients of said external magnetic field.

22. A method as claimed in claim 21, wherein said step (e) includes detecting path length differences between said fifth and sixth optical paths and said sixth and seventh optical paths for determining the gradient of Bz in the y and z directions when said fifth through seventh magnetic transducers are oriented along said z direction, and for determining the gradient of By in the y and z directions when said fifth through seventh magnetic transducers are oriented along said y direction.

23. A method as claimed in claim 22, further comprising the steps of:
   (a) orienting a magnetically sensitive axis of an eighth magnetic transducer along said y direction, said eighth magnetic transducer wrapped with an eighth optical fiber defining an eighth optical path;
   (b) providing a reference optical path not containing a magnetic transducer therein;
   (c) coupling said eighth optical path to said reference optical path to form an interferometer;

(d) transmitting a coherent radiation beam through said eighth optical path and said reference optical path;
(e) applying a bias magnetic field having AC and DC components to immerse said eighth magnetic transducers in said bias magnetic field; and
(f) in the presence of said external magnetic field, detecting optical path length differences between said eighth and reference optical paths to thereby measure the magnetic field By of said external magnetic field.

24. A method as claimed in claim 21, further comprising the steps of
    (a) orienting a magnetically sensitive axis of an additional first through third magnetic transducer along the x direction and orienting a magnetically sensitive axis of an additional fourth and fifth magnetic transducer along one of the y and z directions, each of said additional first through fifth magnetic transducers wrapped with an additional first through fifth optical fiber, respectively;
    (b) transmitting a coherent radiation beam through each of said an additional first through fifth optical fibers to define additional first through fifth optical paths respectively;
    (c) applying a bias magnetic field having AC and DC components to immerse each of said additional first through fifth magnetic transducers in said bias magnetic field;
    (d) in the presence of said external magnetic field, detecting optical path length differences between selected pairs of said first through seventh magnetic transducers and said additional first through fifth magnetic transducers to thereby detect second derivative field gradients of said external magnetic field.

25. A method as claimed in claim 23, further comprising the steps of
    (a) orienting a magnetically sensitive axis of an additional first through third magnetic transducer along the x direction and orienting a magnetically sensitive axis of an additional fourth and fifth magnetic transducer along one of the y and z directions, each of said additional first through fifth magnetic transducers wrapped with an additional first through fifth optical fiber, respectively;
    (b) transmitting a coherent radiation beam through each of said an additional first through fifth optical fibers to define additional first through fifth optical paths respectively;
    (c) applying a bias magnetic field having AC and DC components to immerse each of said additional first through fifth magnetic transducers in said bias magnetic field;
    (d) in the presence of said external magnetic field, detecting optical path length differences between selected pairs of said first through seventh magnetic transducers and said additional first through fifth magnetic transducers to thereby detect second derivative field gradients of said external magnetic field.

26. A method as claimed in claim 19, wherein said external magnetic field is produced by an object on or in a planet, such as earth, and wherein said step (d) includes adjusting said AC and DC components to nullify effects of differences in materials utilized for said magnetic transducers and optical fibers and for nullifying effects of said planet's magnetic field and other fields whose measurements are not of interest.

27. A method as claimed in claim 19, wherein step (b) includes energizing a single mode laser source to generate a single mode coherent radiation beam.

* * * * *